(12) United States Patent
Snitchler et al.

(10) Patent No.: US 6,657,533 B2
(45) Date of Patent: *Dec. 2, 2003

(54) SUPERCONDUCTING CONDUCTORS AND THEIR METHOD OF MANUFACTURE

(75) Inventors: Gregory L. Snitchler, Shrewsbury, MA (US); Dietrich Bonmann, Meckenheim (DE); Martin Lakner, Birmenstorf (CH); Willi Paul, Wettingen (CH)

(73) Assignees: American Semiconductor Corporation, Westborough, MA (US); ABB Transmission & Distribution Technologies, Ltd., Zurich (CH)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/200,411

(22) Filed: Nov. 25, 1998

(65) Prior Publication Data

US 2003/0164749 A1 Sep. 4, 2003

(51) Int. Cl.[7] .......................... H01L 43/00; H01L 43/02; H01L 43/04; H01L 43/06; H01L 43/08; H01L 43/10
(52) U.S. Cl. .................... 338/325; 174/125.1; 505/236
(58) Field of Search ............ 338/325, 13, 58, 338/51, 210, 212, 243; 174/125.1, 15.4, 15.5; 505/236, 237, 238

(56) References Cited

U.S. PATENT DOCUMENTS

| | | | |
|---|---|---|---|
| 3,910,802 A | | 10/1975 | Wong |
| 3,959,549 A | * | 5/1976 | Penczynski et al. ........ 438/213 |
| 4,171,464 A | | 10/1979 | Steyert, Jr. |
| 4,954,479 A | * | 9/1990 | Dubots et al. .................. 505/1 |
| 4,977,039 A | * | 12/1990 | Onishi et al. ................ 428/623 |
| 5,047,389 A | * | 9/1991 | Woolf et al. .................... 505/1 |
| 5,102,865 A | * | 4/1992 | Woolf et al. .................... 505/1 |
| 5,104,849 A | * | 4/1992 | Shinga et al. .................. 505/1 |
| 5,127,149 A | * | 7/1992 | Ozeryansky .................. 29/599 |
| 5,268,530 A | * | 12/1993 | Shimizu et al. ........... 174/35 R |
| 5,387,890 A | * | 2/1995 | Estop et al. ................. 335/216 |
| 5,480,861 A | * | 1/1996 | Tanaka et al. .............. 505/236 |
| 6,275,365 B1 | * | 8/2001 | Kalsi et al. .................... 361/19 |

OTHER PUBLICATIONS

J. F. Bussiere, IEEE Transaction on Magnetics, vol. MAG–13, No. 1, pp. 131–137, Jan. 1977.*
M. S. Walker, IEEE Transaction on Magnetics, vol. MAG–17, No. 1, pp. 908–911, Jan. 1981.*

* cited by examiner

Primary Examiner—Elvin Enad
Assistant Examiner—K. Lee
(74) Attorney, Agent, or Firm—Fish & Richardson P.C.

(57) ABSTRACT

A superconducting conductor and its method of manufacture includes an electrical conductor having a thermal conductor attached to and along a length of superconductor member and separated from the superconductor member by an electrically-insulative material. The member may include a length of superconductor composite having superconducting material and a non-superconducting, electrically conductive matrix material. The electrical conductor is configured to control the manner in which the superconductor transitions from its superconducting state to its non-superconducting (i.e., normal) state due to, for example, a fault current condition. The electrically-insulative material has a thickness for allowing heat from the superconductor to be conveyed to the thermal conductor. The superconducting conductor may be used in conjunction with a superconducting current-limiting device.

20 Claims, 7 Drawing Sheets

SUPERCONDUCTING CONDUCTORS AND THEIR METHOD OF MANUFACTURE

BACKGROUND OF THE INVENTION

The invention relates to superconducting conductors such as composite superconductors.

Superconductors are generally classified as either low or high temperature superconductors. An important property of the superconductor is the disappearance of its electrical resistance when it is cooled below its critical temperature $T_c$. For a given superconductor operating below $T_c$, a maximum amount of current—referred to as the critical current ($I_c$) of the superconductor—exists which can be carried by the superconductor at a specified magnetic field and temperature below its critical temperature ($T_c$) and critical magnetic field ($H_c$) Under these conditions, any current in excess of $I_c$ causes the onset of resistance in the superconductor.

The transition characteristics of low temperature superconducting (LTS) and high temperature superconducting (HTS) materials are quite different. In particular, for an LTS material, the transition between superconducting and non-superconducting occurs rather abruptly. This transition characteristic has made the use of LTS materials attractive in current limiting applications. Such LTS current limiting devices limit the flow of excessive current in electrical systems caused by, for example, short circuits, lightning strikes, or common power fluctuations. However, because the transition temperature of LTS materials is relatively low (i.e., generally about $T_c$=4 K to 30 K), the cost associated with cooling such materials to temperatures below their $T_{cs}$ is high. Moreover, the cryogens used to achieve such low temperature add substantial cost and complexity, thereby lowering reliability of devices using such LTS materials, and must be handled with great care.

On the other hand, the transition characteristic of an HTS material is generally not abrupt. Rather, upon reaching its critical temperature or critical current value, the superconductivity of the HTS material gradually diminishes as its temperature or current flow rises until it reaches a temperature or current value at which the material no longer has any superconductivity characteristic.

Because of the significant non-linearities in the current-to-voltage (I–V) characteristics of both HTS and LTS materials over a range which includes both superconducting and non-superconducting states, small inhomogeneities in the critical current of the superconducting conductor, caused for example, by localized differences in diameter or composition, can lead to an inhomogeneous voltage distribution along the superconducting conductor, and localized thermal destruction of the superconducting conductor at the hot spots in this distribution.

SUMMARY OF THE INVENTION

The invention features an electrical conductor well-suited for superconducting current-limiting applications. The electrical conductor includes an elongated superconductor member including a superconducting material extending along its length. In one aspect, the superconductor member is a composite having superconducting material and a non-superconducting, electrically conductive matrix material. In another aspect, the superconductor member is a bulk superconducting material. In yet another aspect, the superconductor member is a composite having superconducting material mechanically supported by an substantially non-conductive matrix material. The electrical conductor is configured to control the manner in which the superconductor member transitions from its superconducting state to its non-superconducting (i.e., normal) state due to, for example, a fault current condition.

In a general aspect of the invention, the electrical conductor includes a thermal conductor attached to and along the length of the superconductor member, and an electrically-insulative material disposed between the thermal conductor and length of superconductor member, the electrically-insulative material having a thickness for allowing heat from the superconductor member to be conveyed to the thermal conductor.

In another aspect of the invention, a superconducting current-limiting device includes a support structure (e.g., an inner support tube) and the above-described electrical conductor disposed on the support structure.

In general, the superconductor member serves to carry the current during non-fault conditions with low electrical loss. In a preferred embodiment, a superconducting composite having the superconducting material and metal matrix, the matrix can provide an alternate current path to compensate for localized inhomogeneities in the superconductor during non-fault conditions. On the other hand, during a fault condition, the member carries the fault current with a high resistance for short periods of time. The thermal conductor serves as a thermal stabilizer and a heat sink during transient fault current events. In general, the thermal conductor prevents the superconducting material from getting too hot during a fault condition. The electrical conductor must not get too hot for two reasons: 1) it must have a quick thermal recovery characteristic, and 2) rapid large changes in temperature can cause thermal stresses sufficient to destroy the superconducting material. The thermal conductor is directly or indirectly thermally connected to a cooling channel. The cooling channel can be a liquid cryogen bath, gas cooling, or a conduction-cooling path (i.e., copper or alumina).

The electrically insulative material acts as a small thermal and electrical barrier having a two fold purpose. First, the insulative material prevents current transfer from the superconductor member into the thermal conductor. Second, the insulative material causes a delay in the heat transfer between superconductor member and the thermal barrier so that the superconducting material can completely revert to its normal, non-superconducting state.

The electrically-insulative material provides a thermal barrier that reduces the time needed for the superconductor to transition from a superconducting state to a non-superconducting state, thereby reducing the amount of current flowing through the superconducting material of the member and lowering the total current flowing through the electrical conductor. As a result, possible damage to the superconductor member caused by the excessive current flow and mechanical stresses (e.g., hoop stresses) is minimized.

Embodiments of either of the aspects of the invention may include one or more of the following features.

The superconducting material is in the form of a plurality of superconducting filaments, the superconducting filaments surrounded by a non-superconducting, metal matrix (e.g., silver or silver alloy). Alternatively, the superconducting material is in monolithic form as a coating on a non-conductive, or preferably a conductive, ceramic buffer layer supported on a metal substrate (e.g., a nickel, copper or aluminum alloy).

The thermal conductor is formed of spaced-apart thermally-conductive elements. The electrically-insulative material and the thermal conductor, together, form a first laminate. A second laminate is disposed on the first laminate and includes a second sheet of electrically-insulative material disposed on the first plurality of the thermal conductive elements of the first laminate and a second thermal conductor (preferably formed of a second plurality of spaced-apart thermally-conductive elements) attached to the second electrically-insulative material.

The thermally-conductive elements of the first laminate and the thermally-conductive elements of the second laminate are offset from each other relative to the length of the superconductor member. As a result, the electrical conductor has increased mechanical strength, particularly in wound structures.

In certain embodiments, the first laminate is attached to a first side of the length of the superconductor member and the second laminate is attached to a second, opposite side of the length of the superconductor member. The superconductor member in this form is "sandwiched" between two stabilizer members, thereby providing improved thermal stability and mechanical strength.

The superconductor member is in the form of a tape having a thickness in a range between about 25 to 300 microns. The superconducting material is formed of a high temperature, anisotropic superconducting material.

The thermal conductor may be formed from a metal, a metal alloy or an electrical insulator with good thermal conductivity such as a highly mineral filled resin, but preferably is formed of stainless steel. Each of the thermally conductive elements have a thickness in a range between about 100 and 1,000 microns. The electrically-insulative material is formed of a glass epoxy or other material, such as lacquer cured by conventional or UV systems, thermoplastics, epoxy resins, or composites (i.e. glass fiber/resin composites or impregnated papers), capable of serving as an insulator at cryogenic temperatures. In certain embodiments, the electrically-insulative material is a polyimide material having a thickness in a range between about 5 and 50 microns.

In an alternative embodiment, the superconducting material is in monolithic form with the non-superconducting matrix in intimate contact with the superconducting material.

In still another aspect of the invention, a method of fabricating a superconducting composite includes attaching a thermal conductor along a length of high temperature superconductor, and providing an electrically-insulative material between the thermal conductor and the length of high temperature superconductor, the electrically-insulative material having a thickness which allows heat from the high temperature superconductor to be conveyed to the thermal conductor. In embodiments of this aspect of the invention, a first laminate of the thermal conductor and the electrically-insulative material is provided. Further, in certain embodiments, providing the thermal conductor elements along the length of superconductor composite and providing the electrically-insulative material includes removing opposing side portions of an insulated conductive wire.

Other advantages and features will become apparent from the following description and the claims.

DETAILED DESCRIPTION

Figure 1:
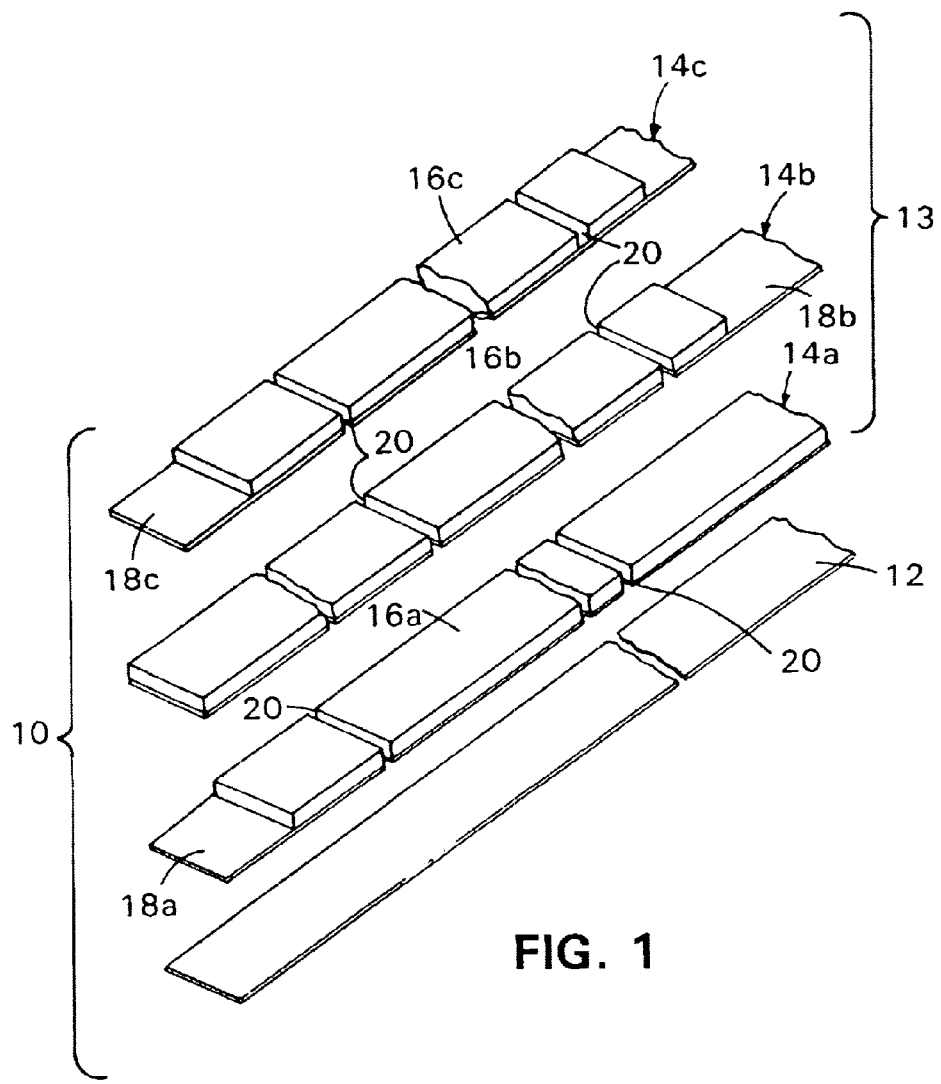
FIG. 1 is an exploded view of a portion of the electrical conductor in accordance with the invention.

Referring to FIG. 1, a superconducting composite 10 includes a superconductor tape 12 formed of high temperature superconductor (HTS) material, such as those made from superconducting ceramics, including metallic oxides, which are typically anisotropic, meaning that they generally conduct better, relative to the crystalline structure, in one direction than another. Anisotropic high temperature superconductors include, but are not limited to, the family of Cu—O-based ceramic superconductors, such as members of the rare-earth-copper-oxide family (YBCO), the thallium-barium-calcium-copper-oxide family (TBCCO), the mercury-barium-calcium-copper-oxide family (HgBCCO), and the bismuth strontium calcium copper oxide family (BSCCO). These compounds may be doped with stoichiometric amounts of lead or other materials-to improve properties (e.g., $(Bi,Pb)_2Sr_2Ca_2Cu_3O_{10-\delta}$)

Superconductor tape 12 has a relatively high aspect ratio (i.e., its width is greater than its thickness) and is fabricated as a multi-filament composite superconductor including individual high temperature superconducting filaments which extend substantially the length of the multi-filament composite conductor and are surrounded by a matrix-forming material (e.g., silver or silver alloy). It may typically have a thickness greater than about 5 microns and up to about 500 microns, preferably 10 to 100 microns.

Because the superconductor is embedded within a conductive matrix, any incremental current above IC is shared between the superconductor and matrix material based on the onset of resistance in the superconductor. The ratio of superconducting material to the total amount of material (i.e., the matrix-forming material and superconducting material) in a given cross-sectional area is known as the "fill factor" and is generally less than 50%. Although the matrix forming material conducts electricity, it is not superconducting. Together, the superconducting filaments and the matrix-forming material form a composite multifilament high temperature superconducting member.

Laminated over superconductor tape 12 is a stabilizer 13 which provides a thermal path for heat generated within the superconductor tape 12 during the period when the tape is transitioning from its superconducting to its normal state for example, due to a fault current. In addition, stabilizer 13 provides mechanical support to superconductor tape 12 by absorbing mechanical stresses (e.g., Lorentz forces, hoop stress) caused by thermal expansion in the tape during the transition period. As will be described below, the mechanical, thermal and dimensional characteristics of the components of stabilizer 13 is critical in controlling the manner in which superconductor tape 12 transitions to its normal state.

Figure 2:
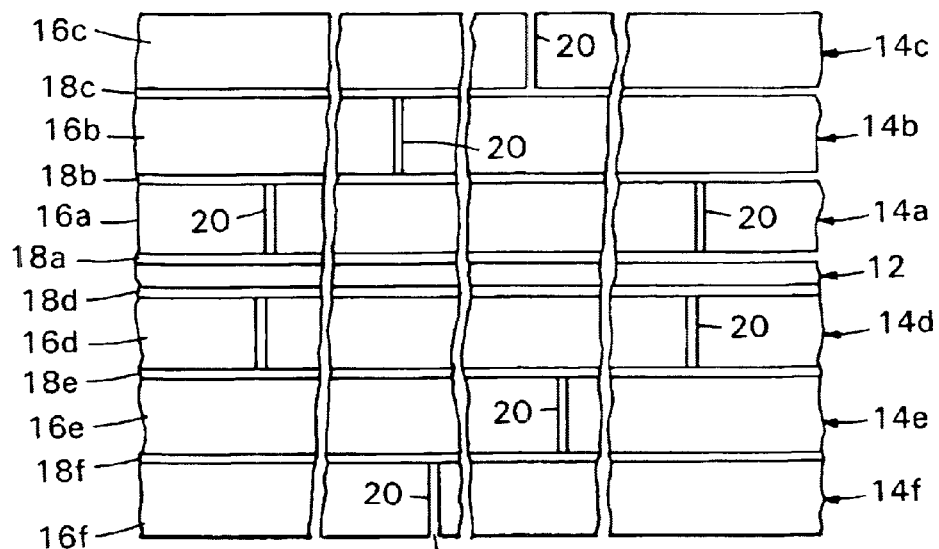
FIG. 2 is a cross-sectional side view of the electrical conductor of FIG. 1.

Stabilizer 13, as shown in FIG. 1, is formed as layers of discontinuous stabilizer members 14a, 14b, 14c, each having a thermally conductive strip 16a, 16b, 16c disposed over an electrically insulative layer 18a, 18b, 18c. Referring to FIG. 2, in alternative embodiments, additional stabilizer members 14d, 14e, 14f having corresponding conductive strips 16d, 16e, 16f which overlie insulative layers 18d, 18e, 18f may be provided on the opposite side of superconductor tape 12, so that superconductor tape 12 lies along a neutral plane of composite 10. Conductive strips 16a–16f are formed of a material of high thermal conductivity and characterized by high modulus, high strength, and flexibility. In certain embodiments, conductive strips 16a–16f are formed of metal, such as stainless steel or copper having good thermal conductivity characteristics at least at the low temperatures in which the invention is operated.

Referring again to both FIGS. 1 and 2, insulative layers 18a–18f are formed of an adhesive-backed polyimide material (e.g., Kapton®, a product of E.I. Dupont de Nemours, Wilmington, Del.) having a thickness (e.g., 5 to 25 microns) much less, typically 5 to 100 times less and preferably at least an order of magnitude less, than that of conductive strips 16a, 16b, 16c (e.g., 300 microns). In particular, insulative layers 18a–18f present a thermal barrier between superconducting composite 10 and stabilizer members 14a, 14b, 14c and preferably has a thermal conductivity at least about an order of magnitude lower than that of stainless steel. The thickness of each of insulative layers 18a–18f is selected to control the speed of the transition of the superconducting material superconductor tape 12 from its superconducting condition to its normal, non superconducting condition. Thus, the superconducting filaments transition to their non-superconducting state so that current flows in the matrix material of the composite, rather than the filaments which have a relatively higher conductivity characteristic in its non-superconducting state. As a result, the total amount of power dissipated in superconducting composite 10 is advantageously reduced and possible destruction of the superconducting filaments is minimized.

Although the stabilizer may be formed as a continuous length of high modulus material, in embodiments which conductive strips 16a–16f are formed of electrically conductive materials, imperfections (e.g., small holes or tears) may exist in the insulative layers 18a–18f. Thus, electrical continuity between conductive strips 16a–16f and superconductor tape 12 can occur. In order to prevent a complete electrical short condition along the length of conductive strips 16a–16f and, instead, present a non-attractive path for current flow, each strip includes discontinuities 20 in the form of gaps along their length to increase the resistivity of stabilizer members 14a–14f at the location of the imperfection.

Figure 3:
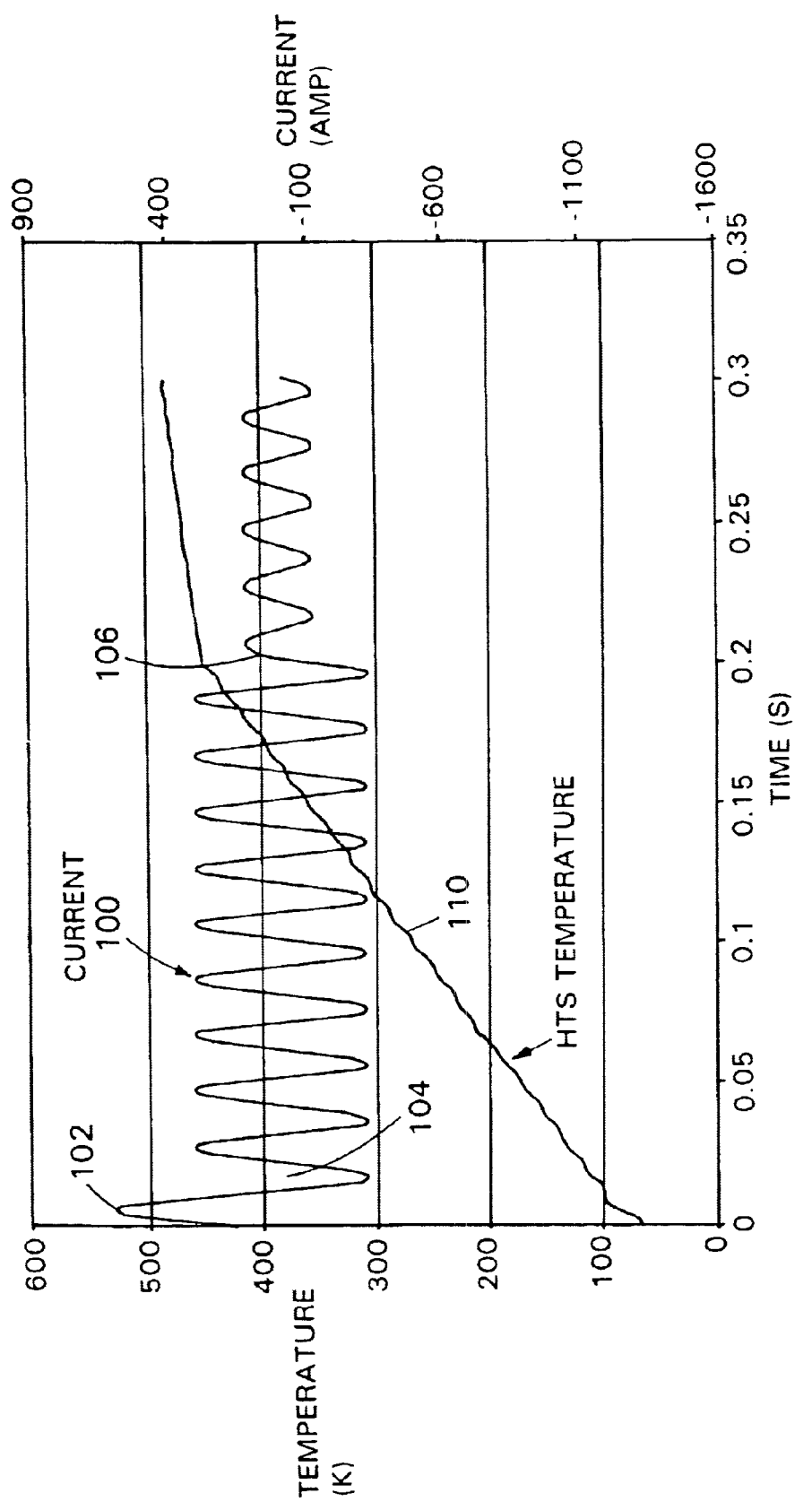
FIG. 3 is a graph showing current and temperature as a function of time for a high temperature superconductor without a thermal stabilizer.
Figure 4:
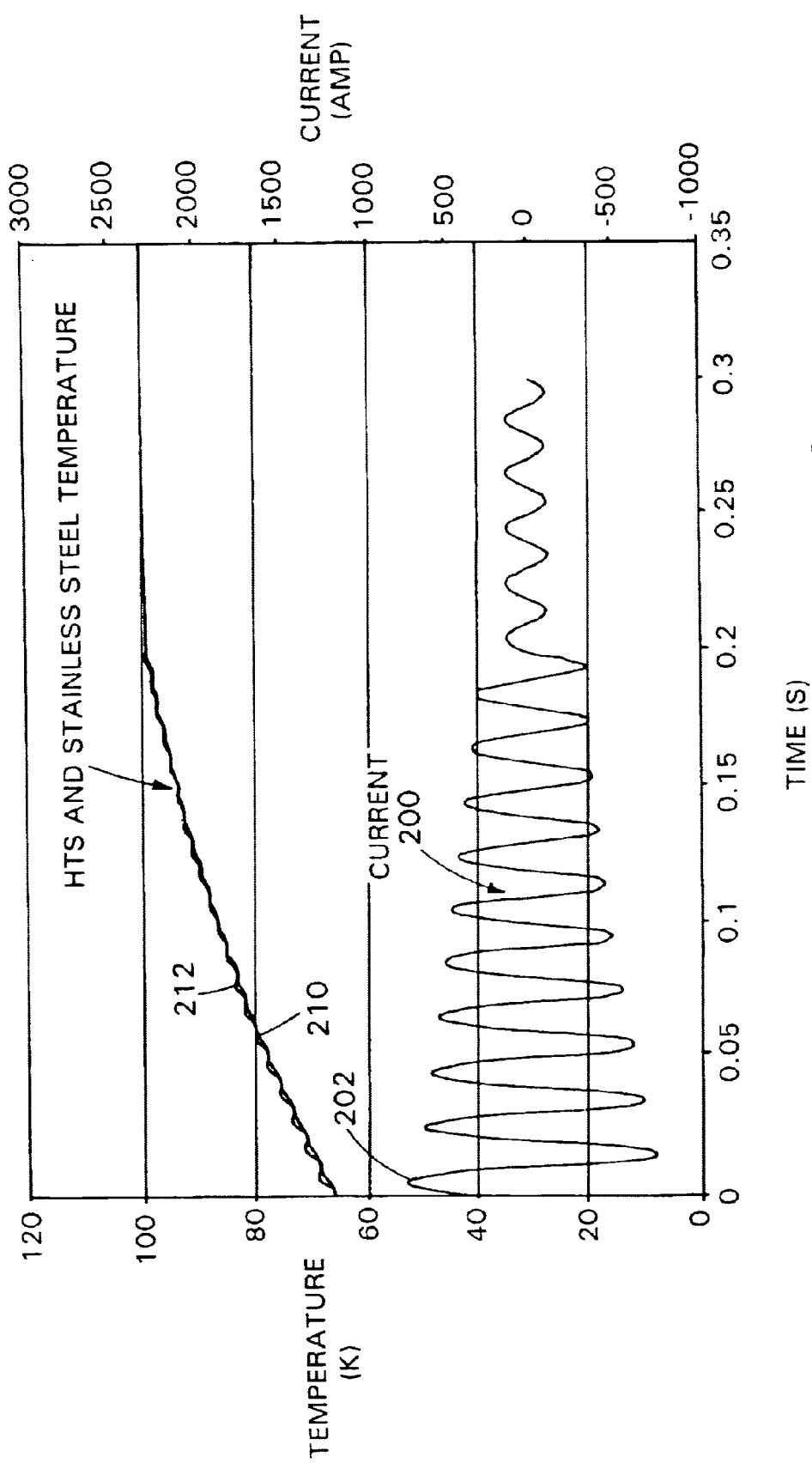
FIG. 4 is a graph showing current and temperature as a function of time for a high temperature superconductor having a thermal stabilizer directly attached thereto.
Figure 5:
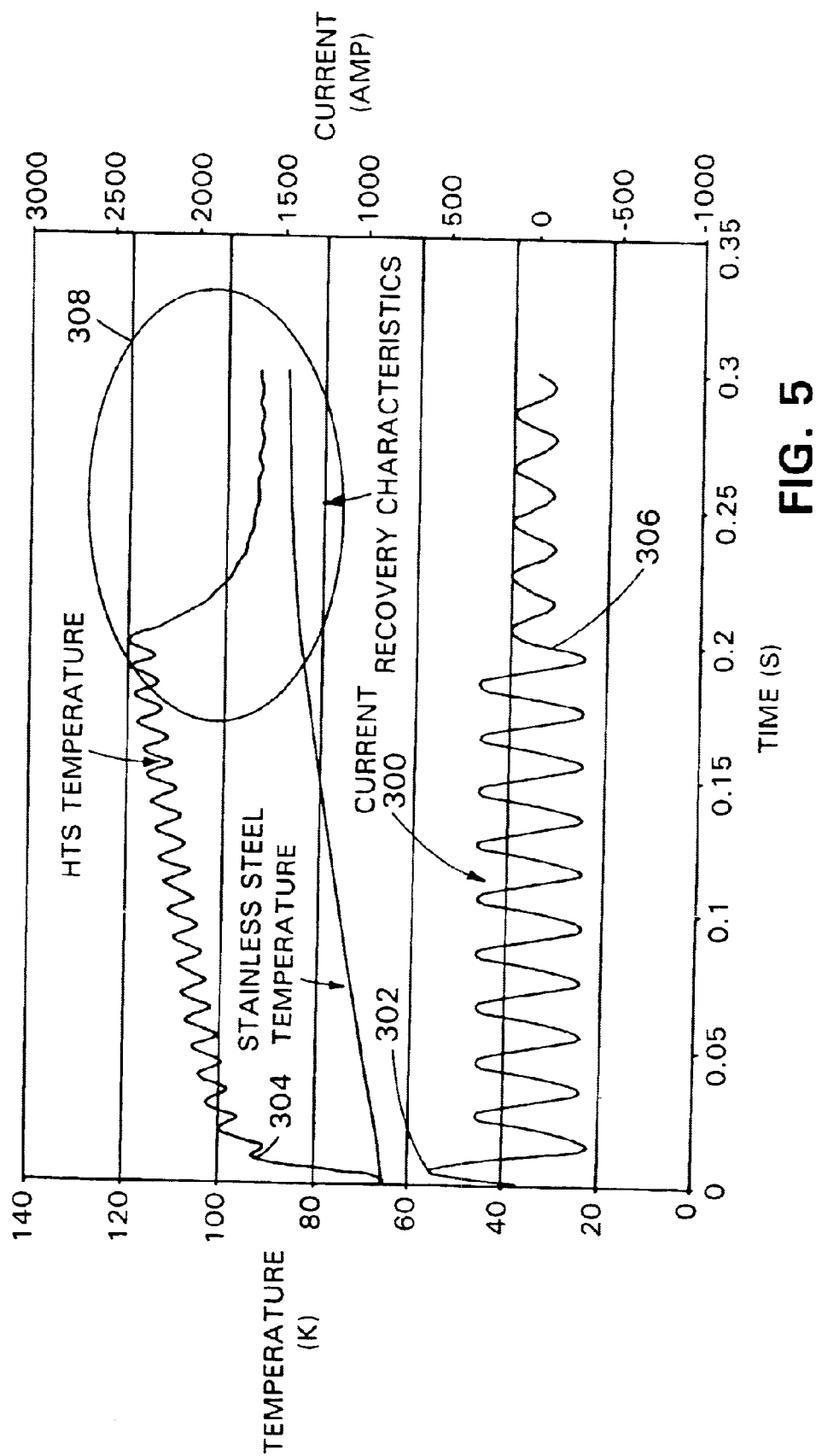
FIG. 5 is a graph showing current and temperature as a function of time for an electrical conductor in accordance with the invention having a thermal barrier positioned between a high temperature superconductor and thermal stabilizer.

Referring to FIGS. 3–5, fault current limiting characteristics for three different superconductor wire arrangements are shown to better demonstrate the advantages of the invention.

Referring to FIG. 3, the fault current limiting characteristics of a superconductor wire without a thermal stabilizer is shown. In particular, waveforms for the current flowing through and temperature of an HTS superconductor (along ordinate) as a function of time (abscissa) are shown. Current waveform 100 is shown initially in a fault condition (e.g., lightning strike) with the current at point 102 exceeding 400 amperes. Temperature waveform 110 of the HTS superconductor is shown to immediately increase at the outset of the fault. Shortly after initiation of the fault (point 104), current waveform 100 drops to a steady state condition with temperature waveform 110 continuing to steadily increase over a 200 millisecond time period, until the fault condition is removed (point 106). At this point, however, the temperature of the superconductor exceeds 400 K, an increase of over 300 K. Generally, an HTS superconductor subjected to increases of over 100 K experience significant damage.

Referring to FIG. 4, the use of a discontinuous stainless steel member serving as a thermal stabilizer, which is disposed along and in direct contact with the same HTS superconductor wire of FIG. 3, is shown. In this case, a current waveform 200, once again is shown initially in a fault condition (point 202). As was the case in FIG. 3, temperature waveform 210 of the HTS superconductor steadily increases at the onset of the fault. Because the thermal stabilizer is in direct contact with the HTS superconductor, the temperature waveform 212 of the stabilizer substantially follows the temperature waveform of the superconductor. However, although the thermal stabilizer tends to decrease the magnitude of the fault current waveform, because the thermal stabilizer and superconductor are in intimate contact, there is no mechanism to force the high temperature superconductor into a normal, non-superconducting state.

Referring to FIG. 5, in accordance with the invention, the use of a discontinuous stainless steel member disposed over the HTS superconductor and a thermal barrier (e.g., Kapton® layer) disposed therebetween is shown. Once again, current waveform 300 is shown initially at a fault condition (point 302). However, because the HTS superconductor member is separated from the discontinuous stainless steel member by the thermal barrier, their respective temperatures do not track each other. Indeed, unlike the arrangement discussed above in conjunction with FIG. 4, because the superconductor member and stabilizer are separated, the temperature of the superconductor increases rapidly from approximately 60 K to about 90 K (point 304). Thus, the superconductor filaments in the superconductor wire reach their critical current values very quickly and becomes less conductive than the surrounding matrix material. The fault current decreases by approximately 50%. Furthermore, when the fault condition is eliminated (point 306), the temperature of the superconductor member decreases rapidly. Thus, the thermal barrier acts to provide a quick thermal recovery (area of enclosed circle 308), thereby reducing possible damage to the HTS superconductor and helping the recovery of the superconductor into its superconducting state.

As discussed above with reference to FIGS. 1 and 2, stabilizer members 14a–14f provide mechanical support to superconductor tape 12 by restricting expansion of superconducting composite 10 due to the sharp change in temperature during the transition period. To provide uniform mechanical support, the position of discontinuities 20 are offset from each other along the length of superconducting composite 10.

Figure 6:
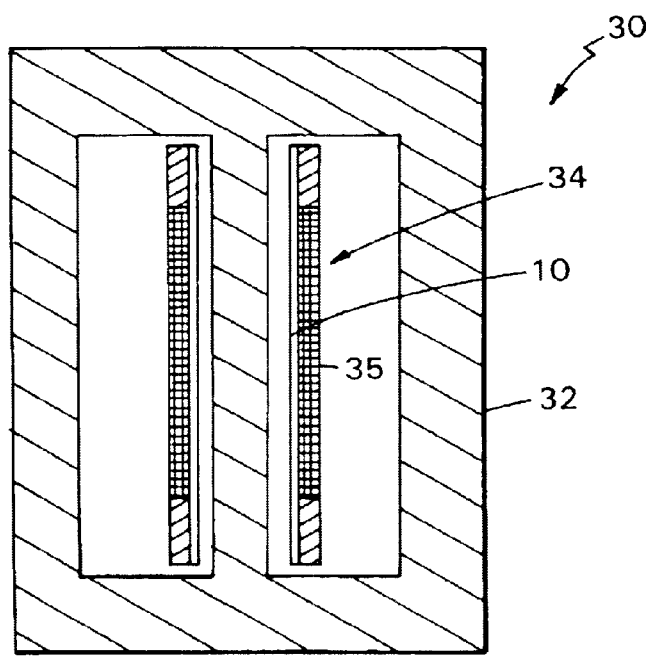
FIG. 6 is a cross-sectional side view of a superconducting coil wound with the electrical conductor of FIG. 1.

Referring to FIG. 6, a mechanically robust, high-performance superconducting current-limiting coil in a transformer assembly 30 includes an iron core 32 and a superconducting current-limiting coil 34. Current-limiting coil 34 is wound around an inner support tube 35 with superconducting composite 10, as described above, which has a low loss characteristic in its superconducting state, but in its normal state has a relatively high resistivity characteristic. Thus, in the event of an electrical current fault, superconductor tape 12 of composite 10 reverts to its normal, non-superconducting, state for a time sufficient to prevent current-limiting coil assembly 30 from being damaged due to overheating. During the time that current is being limited by composite 10 in its normal state, a circuit breaker or fuse can be used to open the circuit and prevent further current flow.

In conjunction with FIGS. 7A–7C, one approach for forming a stabilizer member 14a onto superconducting tape 12 will be described. It is to be appreciated that the same process is used to form the remaining stabilizer members onto superconducting composite 10. Stabilizer member 14a has a width and length commensurate with that of superconducting tape 12.

Figure 7A:
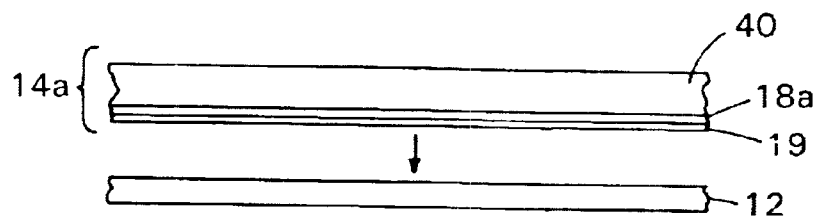
FIGS. 7A–7C illustrate a process for fabricating the superconducting composite of FIG. 1.

Referring to FIG. 7A, stabilizer member 14a is initially provided in the form of a single strip 40 of stainless steel laminated to an insulative layer 18a (e.g., polyimide). The exposed surface of insulative layer 18a has an adhesive 19 to allow further lamination to tape 12.

Figure 7B:
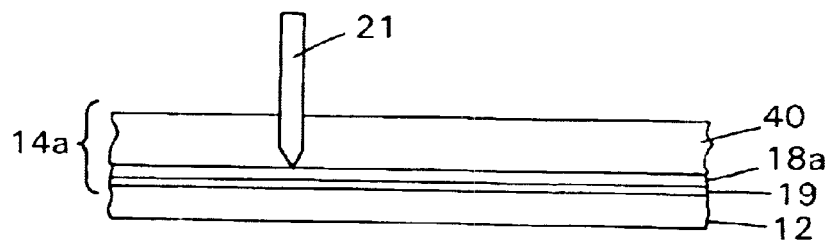
Figure 7C:
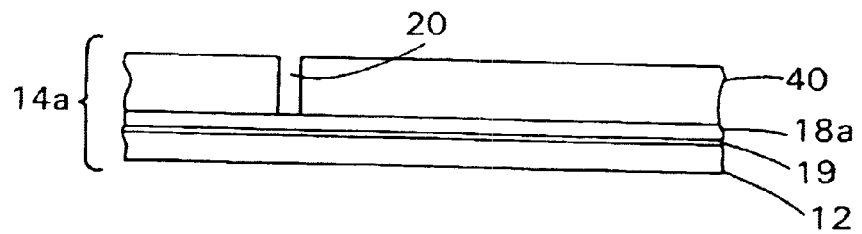

Referring to FIGS. 7B and 7C, after attachment to tape 12, the composite in this form is then provided to a cutting or punching process for forming discontinuities 20 along the length of the composite. High precision is required to ensure that the cutting tool 21 extends through the thickness of the stainless steel without cutting through underlying insulative layer 18a.

Other embodiments are within the claims. For example, although the superconducting composite described above utilized flat, plate-like stabilizer members, the concept of the invention is also applicable with stabilizer members in other forms.

Figure 8:
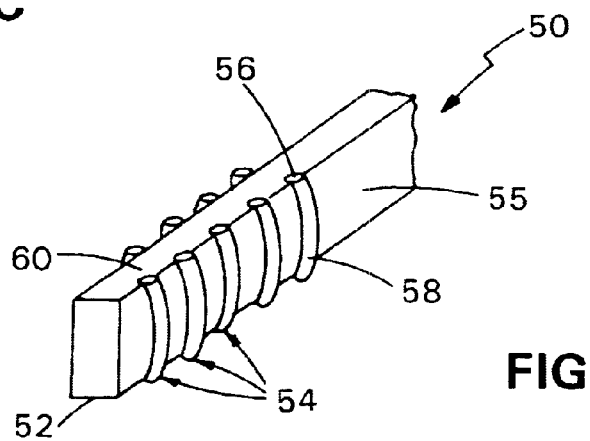
FIG. 8 is perspective view of an alternative approach for forming discontinuities in the thermal stabilizer.

For Example, referring to FIG. 8, a superconducting composite 50 includes a superconducting tape 52 with stabilizer members 54 disposed along wider surfaces 55 of the tape. Each stabilizer member 54 includes a stainless steel or copper conductor 56 having a relatively thin electrically insulative coating 58. Alternatively, an insulating coating may be formed or otherwise provided over exposed surfaces of tape 52. To fabricate superconducting composite 50, stabilizer member is provided in the form of a wire wound about tape 52. Portions 60 (shown in dashed lines) are then removed leaving behind conductor 56.

Figure 9:
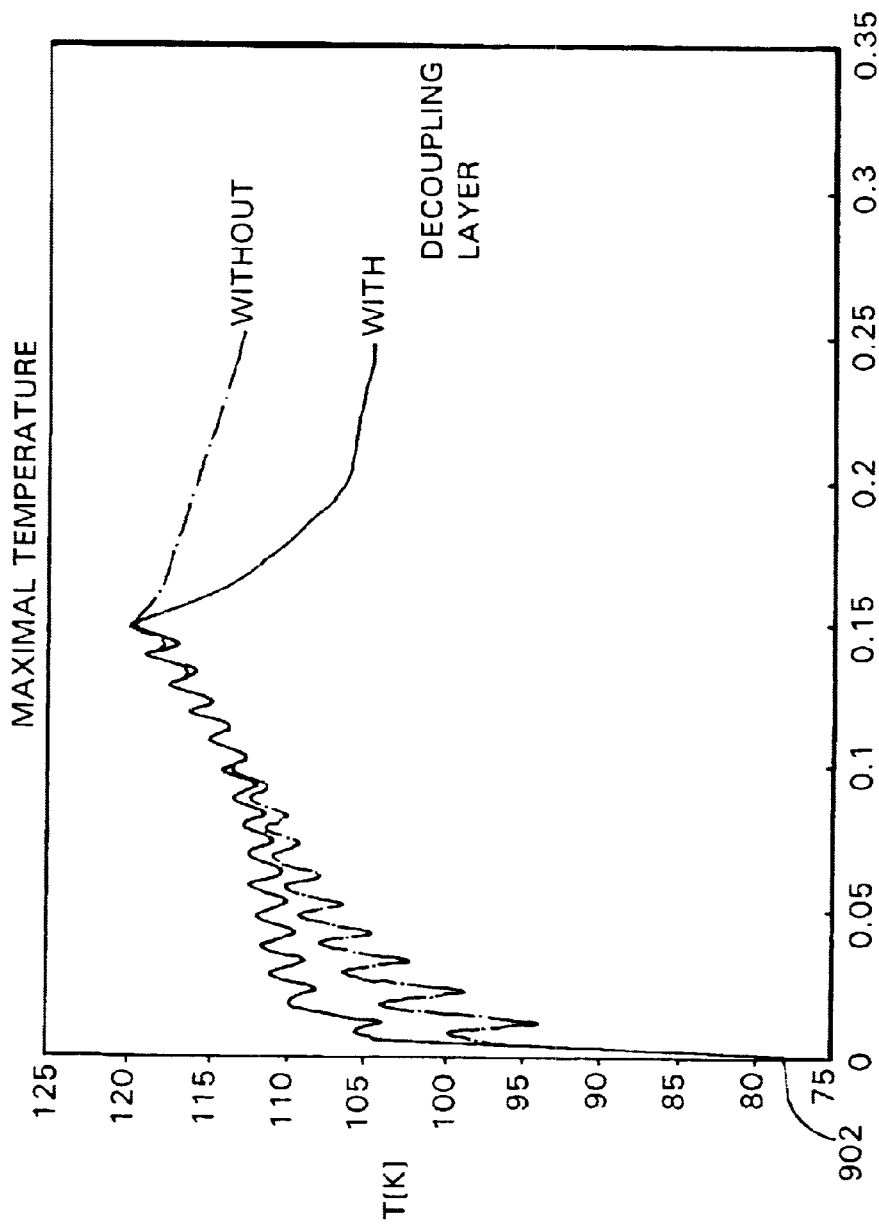
FIG. 9 is a graph showing current and temperature as a function of time for another electrical conductor in accordance with the invention having a thermal barrier positioned between a high temperature superconductor and thermal stabilizer.

Referring to FIG. 9, in accordance with another aspect of the invention, the use of a 300 μm thick continuous steel substrate disposed over the HTS superconductor with a critical temperature of 110 K and a 50 μm epoxy thermal barrier disposed therebetween is shown. A fault condition was simulated by a 150 msec short-circuit, after which the current was turned off. Once again, current waveform 900 is shown initially at a fault condition (point 902). However, because the HTS superconductor member is separated from the steel substrate by the thermal barrier, their respective temperatures do not track each other and a return to the normal, i.e. superconducting, state was possible within 100 ms after the end of the short-circuit. In contrast, an arrangement made with the same 300 μm thick continuous steel substrate disposed over the same HTS superconductor but configured as in FIG. 4 without separation of the superconductor member and stabilizer substrate, would reach steady state at a superconductor temperature greater than 110 K.

Still other embodiments are within the scope of the claims.

What is claimed is:

1. An electrical conductor for carrying electrical current, the conductor comprising:
    an elongated superconductor member including superconducting material surrounded by a conductive matrix;
    a thermal conductor attached to and along the length of the superconductor member; and
    electrically-insulative material disposed between the thermal conductor and the conductive matrix, the electrically-insulative material having a thermal characteristic that allows heat from the superconductor member to be conveyed to the thermal conductor,
    wherein the superconducting material is formed of an anisotropic high temperature superconductor, and
    the superconductor member, the thermal conductor, and the electrically-insulative material are in the form of tapes.

2. The electrical conductor of claim 1 wherein the superconducting material is in the form of a plurality of superconducting filaments surrounded by the metal matrix.

3. The electrical conductor of claim 1 wherein the superconducting material is in monolithic form.

4. The electrical conductor of claim 1 wherein the thermal conductor includes a plurality of thermally-conductive elements, each in a spaced relationship from an adjacent thermally-conductive element.

5. The electrical conductor of claim 4 wherein the electrically-insulative material and the thermal conductor together form a first laminate.

6. The electrical conductor of claim 5 further comprising a second laminate disposed on the first laminate, the second laminate including:
    a second electrically-insulative material disposed on the thermal conductor of the first laminate; and
    a second thermal conductor attached to the second electrically-insulative material.

7. The electrical conductor of claim 6 wherein the second thermal conductor includes thermally-conductive elements, each element longitudinally-spaced from an adjacent element, the thermally-conductive elements of the first laminate and the thermally-conductive elements of the second laminate are offset from each other relative to the length of the superconductor member.

8. The electrical conductor of claim 6 wherein the first laminate is attached to a first side of the length of the superconductor member and the second laminate is attached to a second, opposite side of the length of the superconductor member.

9. The electrical conductor of claim 1 wherein the tape has a thickness in a range between about 5 to 500 microns.

10. The electrical conductor of claim 1 wherein the thermal conductor has a thickness in a range between about 100 and 1,000 microns.

11. The electrical conductor of claim 1 wherein the thermal conductor is formed of stainless steel.

12. The electrical conductor of claim 1 wherein the electrically-insulative material has a thickness in a range between about 5 and 50 microns.

13. The electrical conductor of claim 1 wherein the electrically-insulative material comprises a polyimide material.

14. A current limiting device, comprising:
    an elongated superconductor member comprising superconducting material;

a thermal conductor attached to and along the length of the superconductor member; and electrically-insulative material disposed between the thermal conductor and the length of the superconductor member, the electrically-insulative material having a thermal characteristic that, during a current fault condition, delays for a predetermined time heat transfer from the superconductor member to the thermal conductor, and that subsequently allows heat from the superconductor member to be conveyed to the thermal conductor, wherein the superconducting material is formed of an anisotropic high temperature superconductor, and the superconductor member, the thermal conductor, and the electrically-insulative material are in the form of tapes.

15. The device of claim 14, wherein the superconductor member comprises a superconductor composite including superconducting material and a conductive matrix material in contact with the superconducting material.

16. The device of claim 15, wherein the superconducting material is surrounded by the conductive matrix.

17. The device of claim 14, wherein the thermal conductor comprises longitudinally-spaced and thermally-conductive elements.

18. The device of claim 14, wherein the electrically-insulative material and the thermal conductor together form a first laminate.

19. The device of claim 18, further comprising a second laminate on the first laminate, the second laminate comprising:

a second electrically-insulative material on the thermal conductor of the first laminate; and a second thermal conductor attached to the second electrically-insulative material.

20. The device of claim 19, wherein the first and second thermal conductors comprise longitudinally-spaced and thermally-conductive elements that are offset from each other relative to the length of the superconductor member.

* * * * *